(12) United States Patent
Wang

(10) Patent No.: US 7,999,793 B2
(45) Date of Patent: Aug. 16, 2011

(54) MEDIAN AND MEAN COHERENT FILTER AND METHOD FOR ELIMINATING NOISE IN TOUCH SCREEN CONTROLLER

(75) Inventor: Ing-Yih Wang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 1026 days.

(21) Appl. No.: 11/724,866

(22) Filed: Mar. 16, 2007

(65) Prior Publication Data

US 2008/0224912 A1  Sep. 18, 2008

(51) Int. Cl.
*G06F 3/041* (2006.01)
(52) U.S. Cl. ........................................................ 345/173
(58) Field of Classification Search .................. 345/173, 345/107
See application file for complete search history.

(56) References Cited

U.S. PATENT DOCUMENTS

| | | | |
|---|---|---|---|
| 5,644,308 A * | 7/1997 | Kerth et al. ................... | 341/120 |
| 6,246,394 B1 | 6/2001 | Kalthoff et al. ............... | 345/173 |
| 6,661,408 B2 | 12/2003 | Chen ............................ | 345/173 |
| 6,738,048 B1 | 5/2004 | Rundel ......................... | 345/173 |
| 7,170,017 B2 * | 1/2007 | Chiang et al. ................ | 178/18.01 |
| 2003/0058226 A1 * | 3/2003 | Bertram et al. ............... | 345/173 |
| 2003/0206162 A1 * | 11/2003 | Roberts ........................ | 345/173 |
| 2005/0001811 A1 * | 1/2005 | Chiang et al. ................ | 345/107 |

OTHER PUBLICATIONS

"Specification sheet for Analog Devices Touch Screen Controller AD7877", 2006 Analog Devices, Inc., pp. 1-44.

* cited by examiner

*Primary Examiner* — Quan-Zhen Wang
*Assistant Examiner* — Tony Davis
(74) *Attorney, Agent, or Firm* — John J. Patti; Wade J. Brady III; Frederick J. Telecky, Jr.

(57) ABSTRACT

A touch screen system includes a touch screen assembly (30,31) and a touch screen controller (1A) coupled to terminals (24,25,26,27) of the touch screen assembly (30,31), the touch screen controller (1A) including a controller (41) and an analog to digital converter (22) for generating multiple digital data numbers representing multiple coordinate values, respectively, of a particular touch point (Q) of the touch screen assembly (30,31) in response to control signals (42) generated by the controller (41). A sorting technique is performed to sort the digital data numbers in order of their values, respectively. An averaging technique is performed on at least some of the sorted digital data numbers, including a median sorted digital number.

22 Claims, 5 Drawing Sheets

MEDIAN AND MEAN COHERENT FILTER AND METHOD FOR ELIMINATING NOISE IN TOUCH SCREEN CONTROLLER

BACKGROUND OF THE INVENTION

The present invention relates generally to touch screen systems and touch screen controllers, and more particularly to circuits and methods for reducing/eliminating noise, especially noise associated with the turning on and off of LCDs (liquid Crystal displays) of touch screen assemblies that are controlled by the touch screen controllers.

The closest prior art is believed to include (1) U.S. Pat. No. 6,661,408 entitled "Touch Screen Capable of Isolating Noise Signals" issued Dec. 9, 2003 to Chen, (2) the Analog Devices, Inc. AD7877 touch screen controller specification sheet, (3) commonly assigned U.S. Pat. No. 6,246,394 entitled "Touch Screen Measurement Circuit and Method" issued Jun. 12, 2001 to Kalthoff et al., incorporated herein by reference, and (4) commonly assigned U.S. Pat. No. 6,738,048 entitled "Touch Screen Controller" issued May 18, 2004 to Rundel, also incorporated herein by reference.

"Prior Art" FIG. 1 herein is similar to FIG. 1 of above mentioned U.S. Pat. No. 6,246,394, which discloses a touch screen digitizing system that includes a touch screen unit or assembly 30,31 including a first resistive screen 30 with opposed x+ and x− terminals, a second resistive screen 31 with opposed y+ and y− terminals, and an ADC 22. The various terminals of touch screen assembly 30,31 are connected to corresponding terminals of a touch screen controller (TSC) chip 1A including a first switch 19 which is coupled between a first reference voltage (ground) and the x− terminal, and a second switch 18 which is coupled between the x+ terminal and a second reference voltage +$V_{CC}$ for energizing the first resistive screen 30. A third switch 21 is coupled between ground and the y− terminal, and a fourth switch 20 is coupled between the y+ terminal and $V_{CC}$ for energizing the second resistive screen 31. Switching circuitry 15,17 couples an input of the ADC 22 to the y+ terminal while the first resistive screen 30 is energized and the second resistive screen 31 is not energized, and also couples the input to the x+ terminal while the second resistive screen 31 is energized and the first resistive screen 30 is not energized. More specifically, the various terminals of the resistive screens 30 and 31 are connected to the drains of the various corresponding driver transistors 18, 19, 20 and 21. Control circuit 41 controls the various driver transistors, switches, and ADC 22 by means of conductors 42, and also includes a data register 48 which receives/updates the analog to digital conversion results from ADC 22 so they are available to be read by a host processor 3 via a control/data bus 40. Control circuit 41 also can generate a processor interrupt request signal IRQ on conductor 47. Touch screen controller 1A of FIG. 1 also includes a conventional pen-touch detection circuit (not shown).

A typical PDA (personal digital assistant) or a tablet PC may have a power-saving mode that would turn a signal-indicating LCD (liquid crystal to splay) on and off frequently, and that typically generates a considerable amount of noise that can corrupt digitized touch point coordinate data being produced at the same time.

The two resistive layers of a touch screen assembly normally are placed over and in close proximity to an LCD screen. Therefore, noise can be coupled from the screen onto the resistive layers, causing errors in the measurements of the touch point coordinates. For example, a jitter might be noticeable in the one-screen cursor position. In most LCD touch screen systems, a signal such as an LCD inverts signal or other control signal is present, in the noise usually is coupled onto the touch screen during the active period of this signal. The touch point coordinate data and the noise data both are collected and averaged, and the averaged data includes an offset due to the LCD switching noise.

FIG. 4 of above-mentioned U.S. Pat. No. 6,661,408 to Chen shows a ring-shaped antenna 6 on the bottom of the touch screen assembly which detects noise signals associated with turning on and off of a signal-indicating LCD (liquid crystal display) which indicates if the touch screen sensor is activated. The antenna ring 6 detects the LCD switching noise and produces a signal which is used to remove or cancel the LCD noise from the data. A disadvantage of this prior art is the extra cost of the conductors associated with the antenna 6.

In the Analog Devices AD7877 touch screen controller, it is only during the sample or acquisition phase of the ADC operation that noise from the LCD screen has an effect on the ADC measurements. During the hold or conversion phase, the noise has no effect, because the voltage of the input of the ADC has already been acquired. Therefore, to minimize the effect of noise on the touch screen measurements, the ADC acquisition phase is halted. The LCD control signal should be applied to the STOPACQ pin. To ensure that the ADC acquisition phase never occurs during the noisy period when the LCD signal is active, the AD7877 monitors this signal, and no ADC acquisitions take place when the LCD control signal is active. Any ADC acquisition that is in progress when the LCD signal becomes active is aborted and restarts when the signal becomes inactive again. A disadvantage of this approach is the additional cost of connection of the touch screen controller to the host processor and the additional software burden and synchronization requirements on the host controller.

Even-Odd Transposition Algorithm sorting algorithms are known and disclosed in various references, including the text "The Art of Computer Programming—Searching and Sorting" by D. L. Knuth, Addison-Wesley, 1973. In Prior Art FIG. 2, L is the name of an array L[0:n−1] of n numbers that need to be sorted in accordance with their respective values. The number n is an even integer which represents the size of the array L. "p" is the number of such arrays of numbers that need to be sorted.

Blocks 45, 46, and 47 perform the function of defining the indexing parameters for the loops in the sorting algorithm. For an implementation in which multiple processes are sequentially performed as indicated in the flowchart of FIG. 3B, decision block 48 determines which process is to be performed next, until all processes have been completed, in which case the algorithm stops as indicated by label 49. If the sorting process has not been completed, and affirmative determination is made in decision block 48, and as indicated in block 50, index I is set equal to 0 to establish the procedure of comparing the value of each input word associated with an even-numbered value of index "I" with the value of the input word having the next higher odd-numbered value of index "I". In every such comparison, if the smaller value input word is not already in the lower position in the array L, its position in the array is automatically swapped with the other input word. For example, if the comparison of block 52 determines that the value of input word L[i=2] is lower than the value of input word L[i=3], their positions will be swapped, as indicated in block 53 (wherein "tmp" is a temporary variable). Otherwise their positions will be unchanged, and the sorting algorithm goes from decision block 52 in which the comparison is made to block 54, wherein the index I is incremented by 2. Then the sorting algorithm returns to decision block 51 and compares the incremented index I with the array size number n in block 51 and compares the values of the next lower pair of even index and odd index input words L[i=4] and L[i=5]. The process is repeated until the input word having the highest value is in the top position of the sorted array and the input word having lowest value is located in the bottom position of the sorted array.

For a sequential implementation in which multiple sub-arrays are processed one at a time, when a negative determination is made in decision block 51, the compare and swap process of blocks 51-54 is repeated in blocks 56-60 until a negative determination is obtained in decision block 48. The sorting then is complete, as indicated by "stop" label 49.

There is an unmet need for lower cost touch screen controller circuitry and techniques for reducing/eliminating noise.

There also is an unmet need for lower cost touch screen controller circuitry and techniques for reducing/eliminating noise, such as noise due to switching of an LCD of a touch screen system.

There also is an unmet need for lower cost touch screen controller circuitry and techniques for reducing/eliminating Gaussian noise, such as Gaussian noise in the resistance of the pair of resistive sheets in a touch screen assembly.

SUMMARY OF THE INVENTION

It is an object of the invention to provide a lower cost touch screen controller circuitry and techniques for reducing/eliminating noise.

It is another object of the invention to provide a lower cost touch screen controller circuitry and techniques for reducing/eliminating noise, such as noise due to switching of an LCD of a touch screen system.

It is another object of the invention to provide a lower cost touch screen controller circuitry and techniques for reducing/eliminating Gaussian noise, such as Gaussian noise in the resistance of the pair of resistive sheets in a touch screen assembly.

Briefly described, and in accordance with one embodiment, the present invention provides a touch screen system including a touch screen assembly (30,31) and a touch screen controller (1A) coupled to terminals (24,25,26,27) of the touch screen assembly (30,31), the touch screen controller (1A) including a controller (41) and an analog to digital converter (22) for generating multiple digital data numbers representing multiple coordinate values, respectively, of a particular touch point (Q) of the touch screen assembly (30, 31) in response to control signals (42) generated by the controller (41). A sorting technique is performed to sort the digital data numbers in order of their values, respectively. An averaging technique is performed on at least some of the sorted digital data numbers, including a median sorted digital number.

In one embodiment, the invention provides a circuit for sorting digital data numbers (X0, 1 . . . n) includes an array of rows and columns of state machines (38), each state machine having first (Ai) and second (Bi) inputs, first (Ao) and second (Bo) outputs, and a reset input (R), an equal state to which the state machine can be reset wherein the first input, second input, first output, and second output all are equal, a swap state into which the state machine can be switched if it is in its equal state wherein the first and second inputs are swapped so as to be presented at the second and first outputs, respectively, if the first input is less than the second input, and a pass state into which the state machine can be switched if it is in its equal state wherein the first and second inputs are presented unchanged at the first and second outputs, respectively, if the first input is greater than the second input, wherein if the state machine is switched into either the swap state or the pass state, that state is locked into the state machine until a future reset signal (R) occurs. The digital data numbers are shifted bit by bit into corresponding inputs of the state machines (38) in a first column of the array.

In one embodiment, the invention provides conversion circuitry (1) including circuitry (22) for generating a first number (n) of digital data numbers (X0, 1 . . . n) each having a second number of bits, and sorting circuitry (2A) for sorting the digital data numbers in order of their respective values. The sorting circuitry (2A) includes a plurality of compare and swap state machines (38), including a number of rows of the state machines (38) and a number of columns of the state machines (38). Each state machine (38) has first (Ai) and second (Bi) inputs, first (Ao) and second (Bo) outputs, and a reset input (R). Each state machine (38) has an "equal" state to which the state machine (38) can be reset wherein the first and second inputs and the first and second outputs all are equal, a "swap" state into which the state machine can be switched if it is in its equal state wherein the first (Ai) and second (Bi) inputs are swapped so as to be presented at the second (Bo) and first (Ao) outputs, respectively, if the first input is less than the second input, and a "pass" state into which the state machine can be switched if it is in its equal state wherein the first and second inputs are presented unchanged at the first and second outputs, respectively, if the first input is greater than the second input. If the state machine is switched into either the swap state or the pass state, that state is locked into the state machine until a future reset signal (R) occurs. The first output (Ao) of each odd-numbered state machine is connected to the second input (Bi) of a state machine in a next column of the same row as that odd-numbered state machine, and the second output (Bo) is connected to the first input (Ai) input of a state machine in a next lower row of a next column. The second output (Bo) of each even-numbered state machine is connected to the first input (Ai) of a state machine in a next column of the same row as that even-numbered state machine, and the first output (Ao) is connected to the second input (Bi) of a state machine in a next higher row of a next column. The digital data numbers (X0, 1 . . . n) are shifted bit by bit, with most significant bits first, into the various first and second inputs of the state machines (38) in a first column (Col. 1). A plurality of reset circuits (39), each coupled to the reset inputs (R) of the state machines (38) in a corresponding column, operate to successively apply reset pulses (R) to the reset inputs (R) of the state machines in each column to reset the state machines (38) of each column to the equal state before the most significant bits of the digital data numbers (X0, 1 . . . n) are shifted to the first and second inputs of the state machines of each column.

In a described embodiment, the number of columns is equal to the second number, and the first input of each of a plurality of even-numbered state machines (38) in a top row of state machines (38) is coupled to a first reference voltage ($V_{DD}$) and the second input of each of a plurality of odd-numbered state machines (38) in a bottom row of state machines is coupled to a second reference voltage (GND). A plurality of serial-input digital buffers (62) are coupled to receive sorted digital data numbers from at least some of the various first and second outputs of the state machines (38) of a last column (Col. 7) into which the most significant bits of the digital data words (X0, 1 . . . ) are shifted. At least some of the sorted digital data words are shifted into corresponding serial-input digital buffers (62). The serial-input digital buffers (62) have parallel outputs. A described embodiment, the sorting circuitry is included in a median filter (2A).

In a described embodiment, the circuitry (22) for generating the digital data numbers (X0, 1 . . . n) includes an analog to digital converter (22) of a touch screen controller (1A) and wherein the digital data numbers include multiple cordinate values of a particular touch point (Q) of a touch screen assembly (30,31), the conversion circuitry including a mean filter (2B) for averaging at least some of the sorted digital data numbers (BF4, 5 . . . 10). In one embodiment, the mean filter (2B) is coupled to average all of the sorted digital data numbers. In one embodiment, the mean filter (2B) is coupled to average a plurality of the digital data numbers in a middle range which omits digital data numbers likely to include portions due to unacceptably large noise spike voltages.

In one embodiment, the mean filter (2B) includes multiplexer circuitry (3) coupled to receive a selected number of the sorted digital data numbers and sequentially couple them to inputs of digital adder circuitry (6) for producing a sum of the selected, sorted digital data numbers and divider circuitry (12) for dividing the sum by the selected number to produce an average value of the selected number of the sorted digital data numbers. The sum may include a doubly weighted value of a median sorted digital data number produced by the median filter (2A) and wherein the dividing is accomplished by binary shifting.

In one embodiment, the invention provides a method of filtering digital data, including generating a first number (n) of digital data numbers (X0, 1 . . . n) each having a second number of bits, sorting the digital data numbers in order of their respective values, by shifting the digital data numbers (X0, 1 . . . n) bit by bit, with most significant bits first, into various first and second inputs of a plurality of state machines (38) in a first column (Col. 1) of an array including a plurality of rows of the state machines (38) and a plurality of columns of the state machines (38), each state machine (38) having first (Ai) and second (Bi) inputs, first (Ao) and second (Bo) outputs, and a reset input (R), an equal state to which the state machine (38) can be reset wherein the first and second inputs and first and second outputs all are equal, a swap state into which the state machine can be switched if it is in its equal state wherein the first (Ai) and second (Bi) inputs are swapped so as to be presented at the second (Bo) and first (Ao) outputs, respectively, if the first input is less than the second input, and a pass state into which the state machine can be switched if it is in its equal state wherein the first and second inputs are presented unchanged at the first and second outputs, respectively, if the first input is greater than the second input, wherein if the state machine is switched into either the swap state or the pass state, that state is locked into the state machine until a future reset signal (R) occurs. The method may include coupling the first output (Ao) of each odd-numbered state machine to the second input (Bi) of the state machine in a next column in the same row as the odd-numbered state machine, and coupling the second output (Bo) of that odd-numbered state machine to the first input (Ai) input of a state machine in a next lower row of a next column, coupling the second output (Bo) of each even-numbered state machine to the first input (Ai) of a state machine in a next column of the same row as the even-numbered state machine, and coupling the first output (Ao) of that even-numbered state machine to the second input (Bi) of a state machine in a next higher row of a next column. Successive reset pulses (R) are applied to the reset inputs of the state machines (38) in successive columns to reset the state machines (38) in each column to the equal state before the most significant bits of the digital data numbers (X0, 1 . . . n) reach the first and second inputs of the state machines of that column. In a described embodiment, at least some sorted digital data words produced by the sorting are shifted into a plurality of serial-input digital buffers (62), a middle one of the serial-input digital buffers (62) containing a median sorted digital data word. The sorted digital data words may be averaged by means of a mean filter (2B).

In one embodiment, the invention provides a circuit for filtering a first number (n) of digital data numbers (X0, 1 . . . n) each having a second numbers of bits, including a plurality of rows of the state machines (38) and a plurality of columns of the state machines (38), each state machine (38) having first (Ai) and second (Bi) inputs, first (Ao) and second (Bo) outputs, and a reset input (R), an equal state to which the state machine (38) can be reset wherein the first and second inputs and the first and second outputs all are equal, a swap state into which the state machine can be switched if it is in its equal state wherein the first (Ai) and second (Bi) inputs are swapped so as to be presented at the second (Bo) and first (Ao) outputs, respectively, if the first input is less than the second input, and a pass state into which the state machine can be switched if it is in its equal state wherein the first and second inputs are presented unchanged at the first and second outputs, respectively, if the first input is greater than the second input, wherein if the state machine is switched into either the swap state or the pass state, that state is locked into the state machine until a future reset signal (R) occurs, and means (2A) for sorting the digital data numbers in order of their respective values, by shifting the digital data numbers (X0, 1 . . . n) bit by bit, with most significant bits first, into various first and second inputs of the state machines (38) in a first column (Col. 1) of an array of the state machines (38).

DETAILED DESCRIPTION OF THE PREFERRED EMBODIMENTS

It should be appreciated that the touch screen controller 1A may make a number of analog to digital conversions or measurements of each touch point coordinate voltage, to generate multiple data points which may be processed so as to reduce or eliminate various kinds of noise in order to provide more meaningful and/or accurate digital touch point coordinate values. The median filter of FIGS. 3A-3C and the mean filter of FIG. 4 are useful for processing such multiple data points which represent a touch point coordinate.

Figure 2:
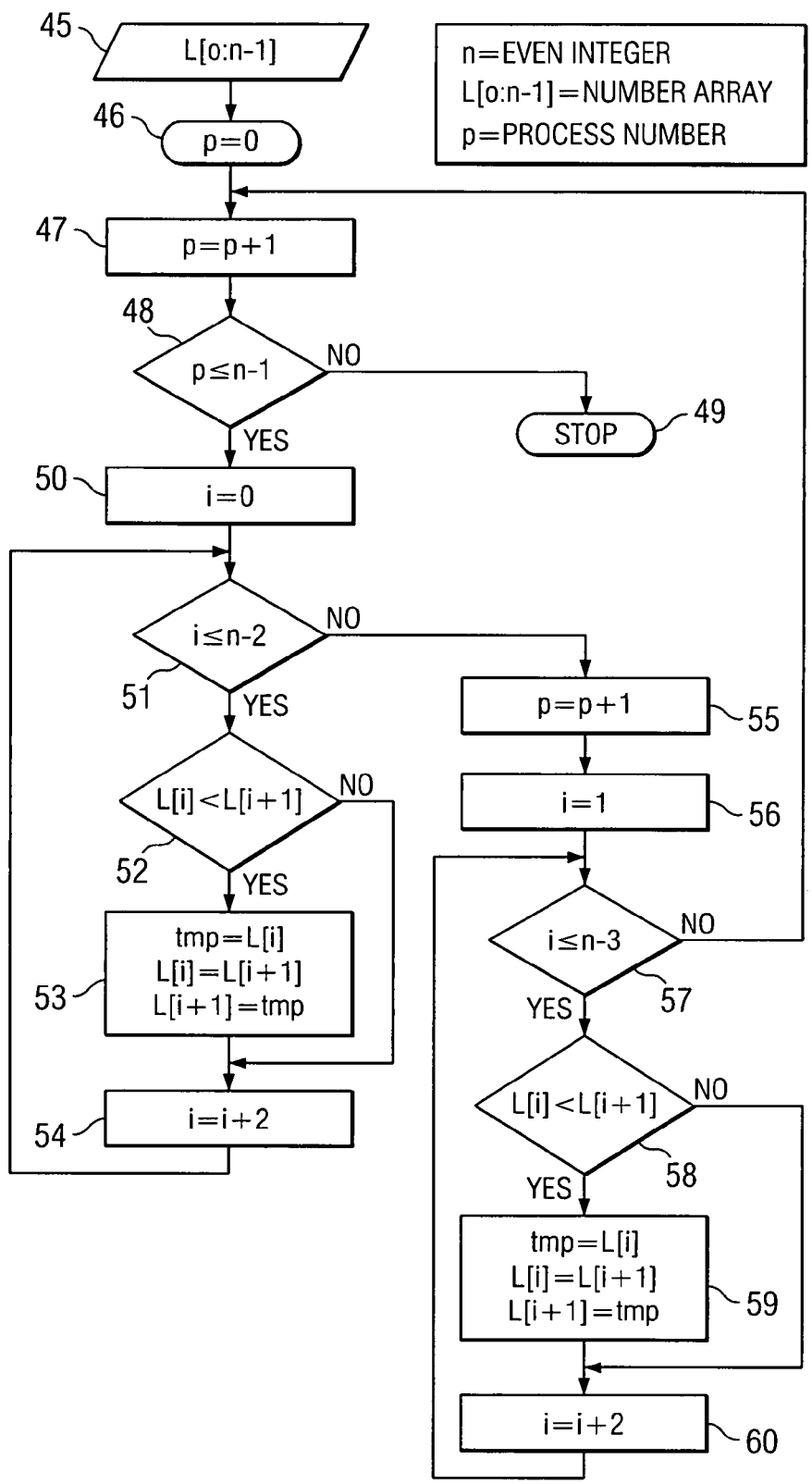
FIG. 2 is a flow chart of a prior art sorting algorithm that can be used in the mean filter of FIG. 3A.

FIG. 2A shows a simplified diagram of the overall structure of the median filter used in the median and mean coherent filter 100 (FIG. 5) of the present invention. Referring to FIG. 3A, Median filter 2A includes four rows of compare and swap state machines 38-ij, wherein "i" is the row number and "j" is the column number. For example, Column 1 includes compare and swap state machines 38-11,21,31 and 41, and Row 2 includes compare and swap machines 38-21, 22 . . . 26 and 27. Each of compare and swap state machines 38 (also referred to simply as "state machines") has an upper input Ai, an upper output Ao, a lower input Bi, and a lower output Bo, as further described below with reference to FIGS. 3B and 3C. Median filter 2A also includes a row of reset circuits 39-1, 2 . . . 7, each of which resets all of the state machines 38 of a corresponding column of state machines 38, respectively. The Ao outputs and the Bo outputs of each of compare and swap state machines 38-17,27,37 and 47 in Column 7 are connected to the inputs of corresponding digital buffers 62-0,1 . . . 7, respectively, as shown in FIG. 3A.

Although for simplicity, only four rows and seven columns of compare and swap state machines are shown in FIG. 3A, eight rows and 15 columns would be more practical in an actual implementation. Accordingly, each of digital buffers 62-0,1 . . . 7 is indicated as having a serial input and a 12-bit, rather than a 7-bit, parallel output which, in a simplified example of FIG. 3A, are designated as BF0, 1 . . . 7, respectively.

The Ai terminals of "even-numbered" state machines 38-12, 38-14 and 38-16 are connected to $V_{DD}$, and the Ao terminals thereof are left open. Similarly, the Bi terminals of "odd-numbered" state machines 38-41, 38-43, and 38-45 are connected to ground and the Ao terminals thereof are left open, and the Bi terminal of state machine 38-47 is connected to ground. For this simplified example, the 7 bits, rather than 12 bits, of each of even-numbered input words X0, X2, X4 and X6 are sequentially shifted into the Ai inputs of state machines 38-11,21,31,41, respectively, and the 7 bits of each of odd-numbered input words X1, X3, and X5 are sequentially shifted into the Bi inputs of state machines 38-11,21, 31,41, respectively. The required sorting occurs as the shifting of the bits of each input word progresses, beginning with the MSB bit of each word. The sorting is complete when the MSB bits all have been shifted from Column 1 to Column 7. The MSB of each input word X0, 1 . . . 6 is always the first bit shifted into the state machines 38-11,21,31,41, respectively, of Column 1.

The Ao output of state machine 38-11 is connected to the Bi input of state machine 38-12, the Bo output of which is connected to the Ai input of state machine 38-13, the Ao output of which is connected to the Bi input of state machine 38-14, and so forth. The Bo output of state machine 38-11 is connected to the Ai input of state machine 38-22, the Ao output of which is connected to the Bi input of state machine 38-13, the Bo output of which is connected to the Ai input of state machine 38-24, and so forth.

Similarly, the Ao output of state machine 38-21 is connected to the Bi input of state machine 38-22, the Bo output of which is connected to the Ai input of state machine 38-23, the Ao output of which is connected to the Bi input of state machine 38-24, and so forth. Similarly, the Bo output of state machine 38-21 is connected to the Ai input of state machine 38-32, the Ao output of which is connected to the Bi input of state machine 38-23, the Bo output of which is connected to the Ai input of state machine 38-34, and so forth.

It can be seen that the above described pattern of input and output connections is repeated for all of the remaining compare and swab state machines 38. The Ao output of each odd-numbered state machine is connected to the Bi input of the state machine in the next column of the same row, and the Bo output is connected to the Ai input of the state machine in the next lower row of the next column. Somewhat similarly, the Bo output of each even-numbered state machine is connected to the Ai input of the state machine in the next column of the same row, and the Ao output is connected to the Bi input of the state machine in the next higher row of the next column.

Figure 3B:
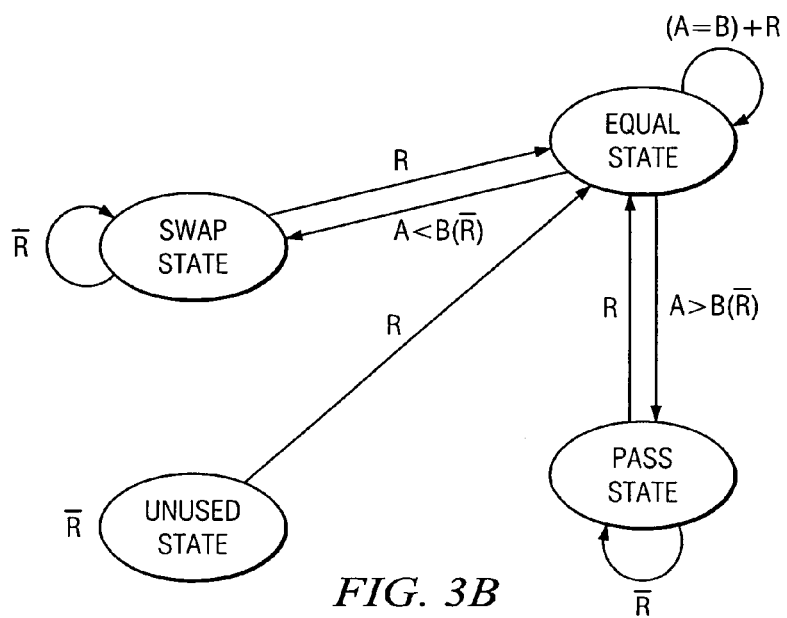
FIG. 3B is a state diagram of a basic state machine that can be used to perform the sorting required in the median filter of FIG. 3A.
Figure 3A:
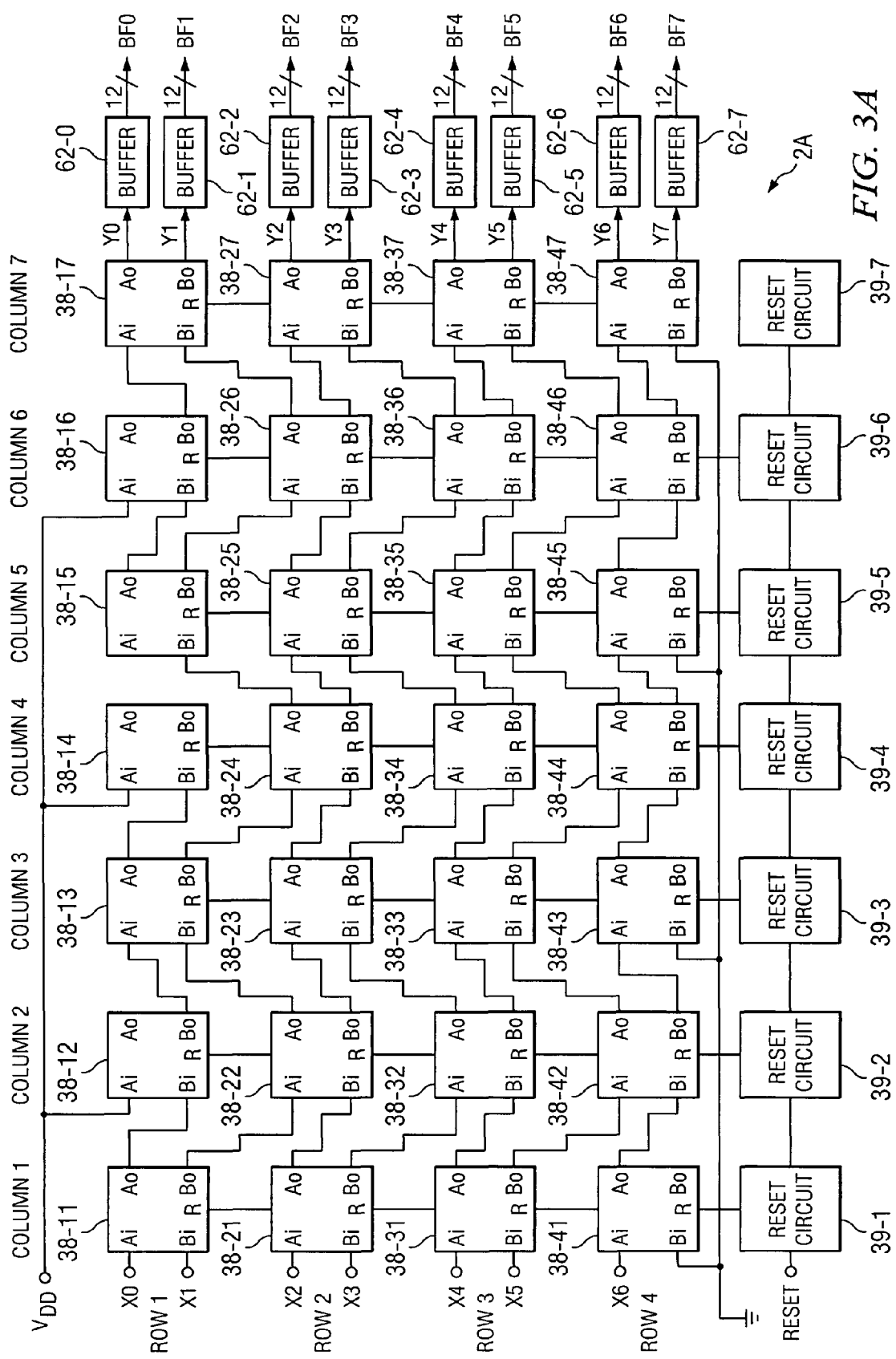
FIG. 3A is a simplified diagram of the structure of a median filter of the present invention.
Figure 3C:
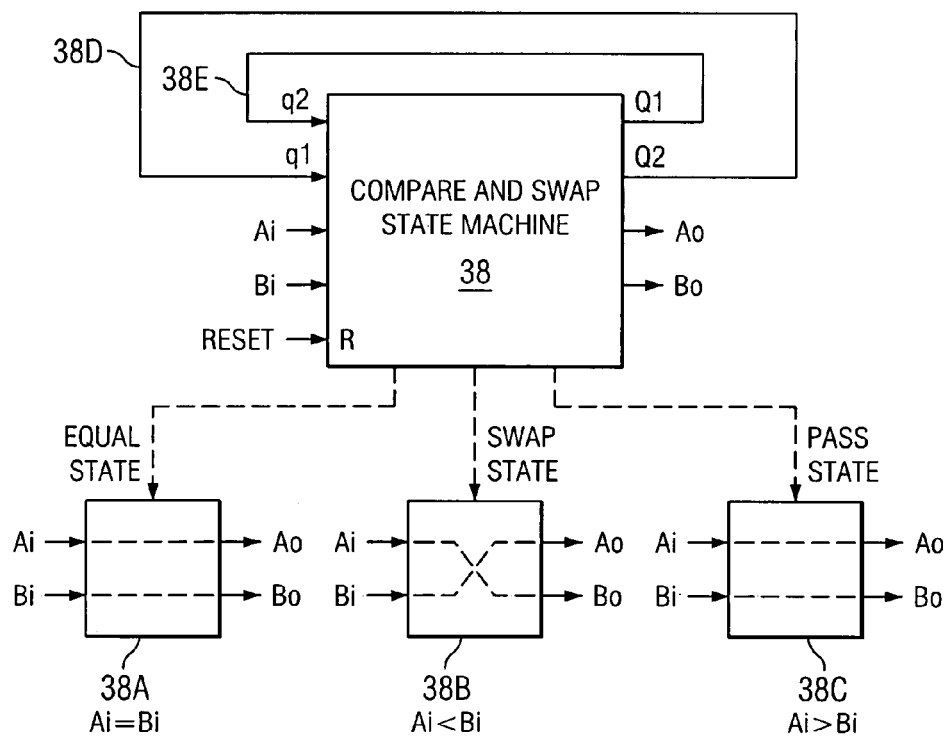
FIG. 3C is a diagram illustrating the three input/output configurations of the state machine corresponding to the state diagram of FIG. 3B.
Figure 4:
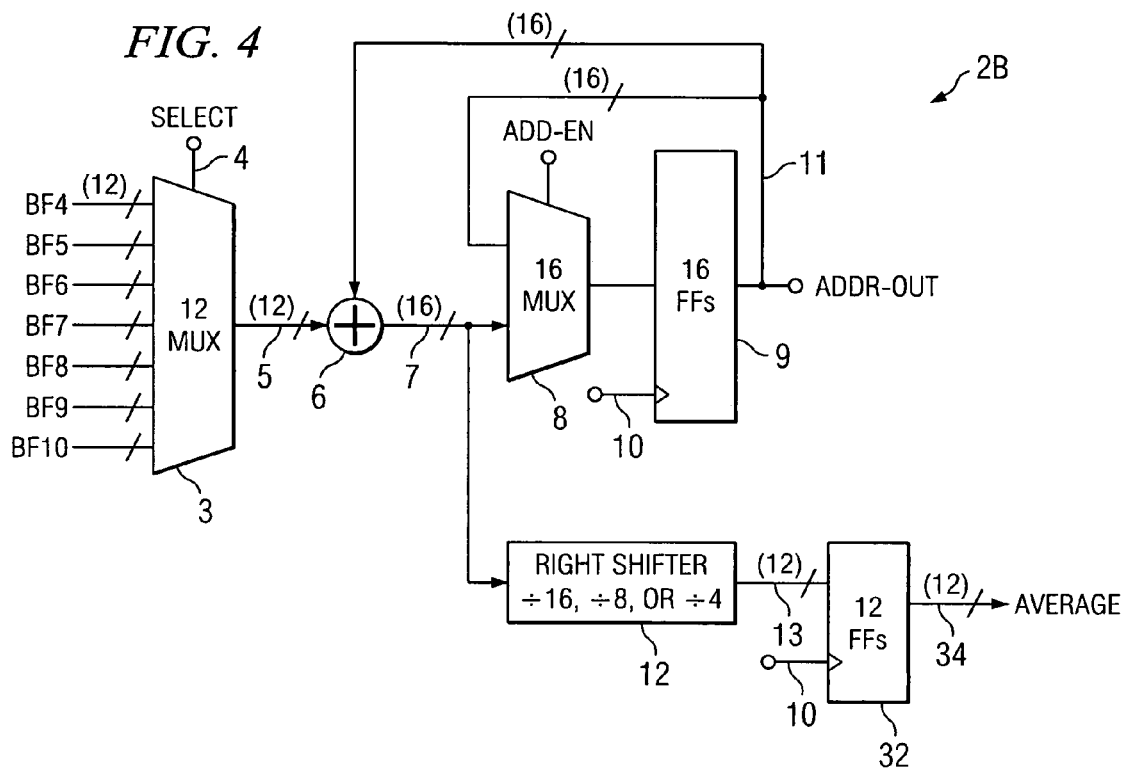
FIG. 4 is a block diagram of a mean filter that can be used in the present invention.

FIG. 3B shows a state diagram of the four possible states of each compare and swap state machine 38, including an unused state, and FIG. 3C illustrates its configuration of each state machine 38 in its three used states. In the state diagram of FIG. 3B, A and B are the state machine inputs, and R is a reset signal which resets state machine 38 to its "equal" state, wherein A=B. state machine 38 must be set to its equal state by the reset signal R before it can be changed to its "pass" state or its "swap" state.

As shown in FIG. 3C, compare and swap state machine 38 has an upper input Ai and a lower input Bi, and a corresponding upper output Ao and a lower output Bo, and also has a reset input R.

The "equal" state of compare and swap state machine 38 occurs in response to a reset pulse R, and is illustrated by block 38A. In the "equal" state, Ai=Ao and Bi=Bo.

The "swap" state is illustrated by block 38B, and occurs when the value of the upper input Ai is less than the value of the lower input Bi, provided state machine 38 is initially in its equal state. In the swap state, the relative positions of the upper input Ai and lower input Bi are swapped. This means Ao=Bi and Bo=Ai. The swap state remains "locked in" until the next reset pulse R arrives.

The "pass state" occurs when the value of the upper input Ai is greater than the value of the lower input Bi, provided state machine 38 is initially in its equal state. In the equal state, the inputs Ai and Bi are simply passed through to the corresponding outputs Ao and Bo, respectively. The pass state remains "locked in" until the next reset pulse R arrives.

To summarize the operation of compare and swap state machine 38 of FIG. 3C, if Ai<Bi, then a compare and swap state machine 38 swaps the lower valued input Ai to the lower position in the array, but otherwise, i.e., if Ai>Bi, then the relative positions of Ai and Bi remain unchanged in the sorting number array. The reset input R resets state machine 38 to its equal state. The foregoing compare and swap state machine 38 makes it possible to perform the sorting process required for median filter 2A in the present invention.

The operation of the sorting machine included in median filter 2A of FIG. 3A will be described next. Referring to FIG. 3A, the operation of the even-odd transposition sorting machine included in median filter 2A of FIG. 3A utilizes the equal, swap, and pass states of each state machine 38 therein. For the equal state, Ao=Ai and Bo=Bi. If Ai<Bi, the state machine 38 switches from its equal state to its swap state wherein Ao=Bi and Bo=Ai and remains locked in its swab state there until the next reset signal R occurs for the column in which the state machine is located. If Ai>Bi, then the state machine switches from its equal state to its pass state wherein Ao=Ai and Bo=Bi, and remains locked in its pass state until the next reset signal R occurs for the column in which the state machine is located.

In FIG. 3A, reset circuits 39-1,2 . . . 7 form a shift register, wherein a reset pulse R propagates from left to right, resetting all of the state machines 38 in each of Columns 1 through 7 just before they received any propagating bits of the data input words X0, 1 . . . 6. For example, reset circuit 39-1 resets all of state machines 38-11,21,31,41 to their respective "equal" states, and after the next data shifting operation, reset circuit 39-2 resets all of state machines 38-12,22,32,42 to their respective "equal" states, and so on so that one by one, each column of state machines 38 is successively reset to the equal state just before the MSB bits of the digital input words X0, 1 . . . 6 are shifted into that column.

For median filtering purposes in which the highest sorting numbers and lowest sorting numbers are likely to consist mainly of noise, eliminating them for purposes of the subsequent mean filtering results in a more accurate averaging if a mean filter is utilized in conjunction with median filter 2A. In the simplified median filter example illustrated in FIG. 3A, the sorted word at the Y4 position has the median value, and the seven-bit sorted data words Y3, 4, 5 could be used in the averaging by the mean filter to delete noise spikes represented in the sorted input words at the top and bottom of the sorted input word list. In an actual implementation, the words more likely would be 12-bit data words, and the compare and swap state machine array size could be 8 rows by 15 columns.

Next, an example is described with reference to Table 1 and Table 2 below to illustrate how the state machines 38 in FIG. 3A operate on a sequence of input word bits as they are shifted from left to right so as to result in correct sorting of the input numbers by the time all of the MSB bits are shifted into the right or last column of state machines 38 in FIG. 3A. In this example, the 7-bit input words X0, 1 . . . 6 have the values indicated in the list shown in Cable 1, with Bit 1 being the MSB (most significant bit) and Bit 7 being the LSB (least significant bit). Input word X0 is located at the top of the list and input word X6 is at the bottom of the list, which corresponds to the order of input words X0, 1 . . . 6 in FIG. 3A.

TABLE 1

| | Bit # | | | | | | |
|---|---|---|---|---|---|---|---|
| | 1 | 2 | 3 | 4 | 5 | 6 | 7 |
| X0 = | 0 | 1 | 0 | 1 | 0 | 0 | 0 | Top |
| X1 = | 0 | 0 | 0 | 1 | 1 | 1 | 1 | |
| X2 = | 0 | 0 | 1 | 0 | 0 | 0 | 0 | |
| X3 = | 0 | 0 | 0 | 1 | 1 | 1 | 1 | |
| X4 = | 0 | 0 | 1 | 0 | 1 | 0 | 0 | |
| X5 = | 0 | 0 | 1 | 0 | 1 | 0 | 0 | |
| X6 = | 0 | 1 | 0 | 1 | 0 | 0 | 0 | Bottom |

First, the MSB Bit 1 of each of input words X0, 1 . . . 6 is shifted into the appropriate state machine 38 in Column 1 of median filter 2A, as shown in FIG. 3A. Each state machine then compares it to inputs Ai and Bi and determines whether to remain in its initial equal state (if Ai=Bi), switch to its pass state (if Ai>Bi), or switch to its swap state (if Ai<Bi). When a state machine is switched to either its pass state or its swap state, it must remain in that state until it receives a reset pulse R (see FIGS. 2B and 2C) that propagates high head of the MSB bits of the input words X0, 1 . . . 7 from left to right through reset circuits 39-1,2 . . . 7 in FIG. 3A.

Similarly, the MSB Bit 1 of each of input words X0, 1 . . . 6 is shifted from Column 2 into the inputs of appropriate state machines 38 in Column 3 as indicated by the connections shown in median filter 2A of FIG. 3A, Bit 2 of each of input words X0, 1 . . . 6 is shifted from Column 1 into the inputs of appropriate state machines 38 in Column 2 as indicated by the connections shown in median filter 2A. Bit 3 of each of input words X0, 1 . . . 6 is shifted into the appropriate state machine 38 in Column 1. Again, each state machine in Columns 1, 2 and 3 then compares its inputs Ai and Bi and determines whether to remain in its initial equal state (if Ai=Bi), switch to its pass state (if Ai>Bi), or switch to its swap state (if Ai<Bi). The MSB Bit 1 of each of input words X0, 1 . . . 6 is shifted into the appropriate state machine 38 in Column 1, as shown in FIG. 3A. Each state machine then compares its inputs Ai and Bi and determines whether to remain in its initial equal state (if Ai=Bi), switch to its pass state (if Ai>Bi), or switch to its swap state (if Ai<Bi).

A similar procedure is repeated until Bits 1,2 . . . 7 of each of input words X0, 1 . . . 6 have been shifted into appropriate state machines 38 of Columns 7, 6 . . . 2, 1, respectively. At that point, input words X0, 1 . . . 6 have been sorted in order of their numerical value, with the largest values at the top of the array of state machines 38 and the lowest values at the bottom of the array. The sorted input words then are serially shifted into digital buffers 62-0,1,2 . . . 7, and can be referred to as "sorted input words" BF0, 1 . . . 7, respectively. (One way of demonstrating the sorting operation of median filter 2A is to make seven copies of FIG. 3A, and use them to note the resulting "1"s and "0"s on the inputs and outputs of each state machine 38 for each successive shift the bits of input words X0, 1 . . . 6 into the state machines of Columns 1, 2 . . . 7. The input comparisons made by each state machine, the resulting states (equal state, pass state, or swap state) of each state machine, and the resulting logic output levels of each state machine after each of the seven shifts can be noted.)

The effect of sequentially resetting the successive columns of state machines 38 by reset circuits 39-1,2 . . . 7 only once during each input word sorting process is that once a state machine 38 is reset during a particular input words sorting process, if it later switches from its equal state to either its swap state or its pass state during that input word sorting process, it must remain locked in that swap state or pass state until it receives the next reset pulse R during a subsequent sorting of another group of input words X0, 1 . . . 6. That means that if a state machine 38 in median filter 2A achieves its swap state during a particular input word sorting operation, it will thereafter swap its inputs even if Ai>Bi until it is reset during the next input word sorting process. Similarly, if a state machine achieves its pass state during a particular input word sorting process, it will thereafter pass its inputs to its corresponding outputs during the remainder of that input word sorting process (i.e., until it is reset during the next input word sorting process) even if Ai<Bi.

Table 2 illustrates an example which shows the "locked-in" pass states and swap states of the various state machines 38 in FIG. 3A which result from the input words X0, 1 . . . 6 of Table 1 being sequentially shifted into the state machines 38 of Column 1, with the state machines 38 of each of Columns 1 through 7 being reset once, just before input data is received at the inputs of that column.

TABLE 2

| Input Word | Col. 1 | Col. 2 | Col. 3 | Col. 4 | Col. 5 | Col. 6 | Col. 7 |
|---|---|---|---|---|---|---|---|
| X0(3) | 1 | | 1 | | 1 | | 1 |
| Row1-even | | pass | | pass | | pass | | equal |
| X1(3) | 0 | 0 | 0 | 0 | 0 | 1 | 1 |
| Row1-odd | | | equal | | equal | | swap |
| X2(3) | 0 | 0 | 0 | 0 | 1 | 0 | 0 |
| Row2-even | | equal | | equal | | swap | | equal |
| X3(3) | 0 | 0 | 0 | 1 | 0 | 0 | 0 |
| Row2-odd | | | equal | | swap | | equal |
| X4(3) | 0 | 0 | 1 | 0 | 0 | 0 | 0 |
| Row3-even | | equal | | swap | | equal | | equal |
| X5(2) | 0 | 1 | 0 | 0 | 0 | 0 | 0 |
| Row3-odd | | | swap | | equal | | equal |
| X6(2) | 1 | 0 | 0 | 0 | 0 | 0 | 0 |
| Row4-even | | pass | | equal | | equal | | equal |
| GROUND | 0 | | 0 | | 0 | | 0 |

As previously mentioned, the touch screen coordinate data represented by input words X0, 1 . . . 6 includes noise, typically including noise spikes due to the previously mentioned LCD switching, and may also include some Gaussian noise. The median filter 2A is effective for eliminating noise spikes of either polarity, but is not effective for eliminating Gaussian noise, which typically is present in the mid-range of sorted input words BF0, 1, 2 . . . produced by median filter 2A. In some cases, median input words may be acceptable representations of the touch screen coordinates. In other cases, it may be desirable to have both median filtering and mean filtering in order to eliminate both noise spikes and Gaussian noise. In other cases, a user may only want to use a mean output value which is the average of some or all of the sorted input words BF0, 1, 2 . . . .

In accordance with the present invention, the foregoing median filtering process may be used in conjunction with a mean filter to provide a "median and mean coherent filter" which may be advantageously utilized in a touch screen controller to effectively and inexpensively reduce or remove noise associated with LCD switching.

Referring to FIG. 4, an averaging or mean filter 2B is shown which can be advantageously used to average some or all of the sorted outputs of median filter 2A of FIG. 3A so as to provide the above mentioned median and mean coherent filter (see subsequently described FIG. 5). Mean filter 2B includes a multiplexer 3 which can be implemented as a combination of 12 parallel-connected multiplexers (not shown). The inputs of multiplexer 3 are assumed to be taken from the digital buffers 62 (FIG. 3A) of a somewhat more complex median filter than the one shown in FIG. 3A wherein 8 rows of state machines 38 receive 15 unsorted digital input words X0, 1, 2 . . . 14, each of which is a 12-bit word, so that 12 columns of state machines 38 are utilized. Therefore, 15 digital buffers 62-0,1,2 . . . 14 which contain the 15 sorted digital input words are utilized. Digital buffers 62-0,1,2 . . . 14 have parallel 12-conductor output busses BF0, 1, 2, . . . 14. For convenience, the sorted digital input words also can be referred to as "sorted digital input words" BF0, 1, 2 . . . 14. The buffer output busses BF0-14 each include 12 bits, which can be referred to as Bits 1,2 . . . 12.

In FIG. 4, it is also assumed that only seven of the 12-conductor buffer output busses BF4, 5 . . . 10 are provided as inputs to the 12 multiplexers 3, with the upper 4 buffer output busses BF0, 1, 2, 3 and the lower 4 buffer output busses BF11, 12, 13, 14 being unused in order to eliminate upper and lower voltage noise spikes, respectively.

To help clarify the somewhat simplified structure illustrated in FIG. 4, the 12 multiplexer sections (not shown) that would be included in 12-section multiplexer 3 are referred to herein as MUX 1,2 . . . 12. Bits 1,2 . . . 12 of BF4 would be connected to the first input (i.e., the BF4 input) of each of multiplexer sections MUX 1,2 . . . 12, respectively, of 12-section multiplexer 3. Bits 1,2 . . . 12 of BF5 would be connected to the second input (i.e., the BF5 input) of each of multiplexer sections MUX 1,2 . . . 12, respectively, of 12-section multiplexer 3. Bits 1,2 . . . 12 of BF6 would be connected to the third input (i.e., the BF6 INPUT) of each of multiplexer sections MUX 1,2 . . . 12, respectively, and so on. Finally, Bits 1,2 . . . 12 of BF10 would be connected to the 12th input (i.e., the BF10 input) of each of multiplexer sections MUX 1,2 . . . 12, respectively.

The 12 outputs of the 12 multiplexer sections MUX 1, 2 . . . 12 of multiplexer 3 would be connected to 12 terminals of a first input of a 16-bit digital adder 6. The other 4 terminals of the first adder input receive a leading edge "0"s (to allow subsequent division by binary shifting). The 16 outputs of digital adder 6 are connected to the inputs of a multiplexer 8 which can have 16 parallel sections connected in the same general manner described above with respect to multiplexer 3. The outputs of the 16 sections of multiplexer 8 are connected to the inputs of 16 flip-flops 9, respectively. The outputs of the 16 flip-flops 9 are fed back both to corresponding inputs of the 16 sections of multiplexer 8 and to the 16 terminals of the second input of digital adder 6.

The 16 outputs of digital adder 6 also are connected to the 16 inputs of a conventional right shift circuit 12. Right shift circuit 12 has a 12 bit output connected to the conductors of a 12-bit bus 13. The conductors of 12-bit bus 13 are connected to the inputs of 12 flip-flops 32, respectively. Right shift circuit 12 is capable of performing ÷4, ÷8, or ÷16 operations by 1-bit, 2-bit or 3-bit binary shifting, respectively, depending (at the option of the user) on whether 4, 8, or 16 of the 15 sorted digital input numbers BF0, 1, 2 . . . 14 have been input to multiplexer 3 to provide the 16-bit output of digital adder 6 after all of the sorted digital input words (for example, BF4, 5 . . . 10) have been accumulated and added (by means of digital adder 6, multiplexer 8, and flip-flops 9).

In operation, the selection inputs 4 of the 12 sections included in multiplexer 3 are activated so as to cause sequential adding of the group of sorted input words selected to be averaged, which in this example are sorted input words BF4, 5 . . . 10.

The circuitry including a 16-bit adder 6, 16-section multiplexer 8, and 16 flip-flops 9 function to successively receive the 12 inputs from multiplexer 3 and the above mentioned four leading edge "0"s which are added to the 16-bit number being accumulated in the 16 flip-flops 9 so that flip-flops 9 accumulate the total value of the selected, sorted touch point cordinate values stored in digital buffers 62 (FIG. 3A). An ADD ENABLE signal performs the function of allowing new outputs of adder 6 to be loaded into flip-flops 9 or simply holding the present values in flip-flops 9. The selection inputs 4 of 12-section multiplexer 3 successively select the 12-bit sorted input words BF4, 5 . . . 10 and route them into the first input of 16-bit adder 6.

Right shifter circuit 12 calculates the desired average by binary shifting of the accumulated sum that appears on the 16 output conductors 7 of digital adder 6 after all of the selected, sorted input words have been added.

The user can select which of the sorted input data words BF0,1,2 . . . are to be totaled, and can divide the number of selected input data words (e.g., 16, 8, or 4, which corresponds to the window size W in subsequently described FIG. 5) and shift them by 4, 3, or 2 bit positions, respectively, to obtain the desired average or mean value.

In the foregoing example, it should be appreciated that the value of the median input word BF7 is double-weighted so that there are 8 accumulated values of sorted input words. Then, the sum of the 8 accumulated values can be easily divided by 8 by a three-bit binary shift in order to produce the desired mean value.

The median filter 2A of the mean and median coherent filter described herein processes n sets of incoming data in serial bit streams by sorting them in descending order. After the sorting machine, only the middle W channels are fed to a special designed adder to perform averaging. A practical embodiment of the described mean and median coherent filter 100 shown in FIG. 5 was designed for 15 windows and 12 bit word lengths with W=7, 3, or 1, which corresponds to choosing 7, 3, or 1 for the size of averaging window after sorting.

Figure 1:
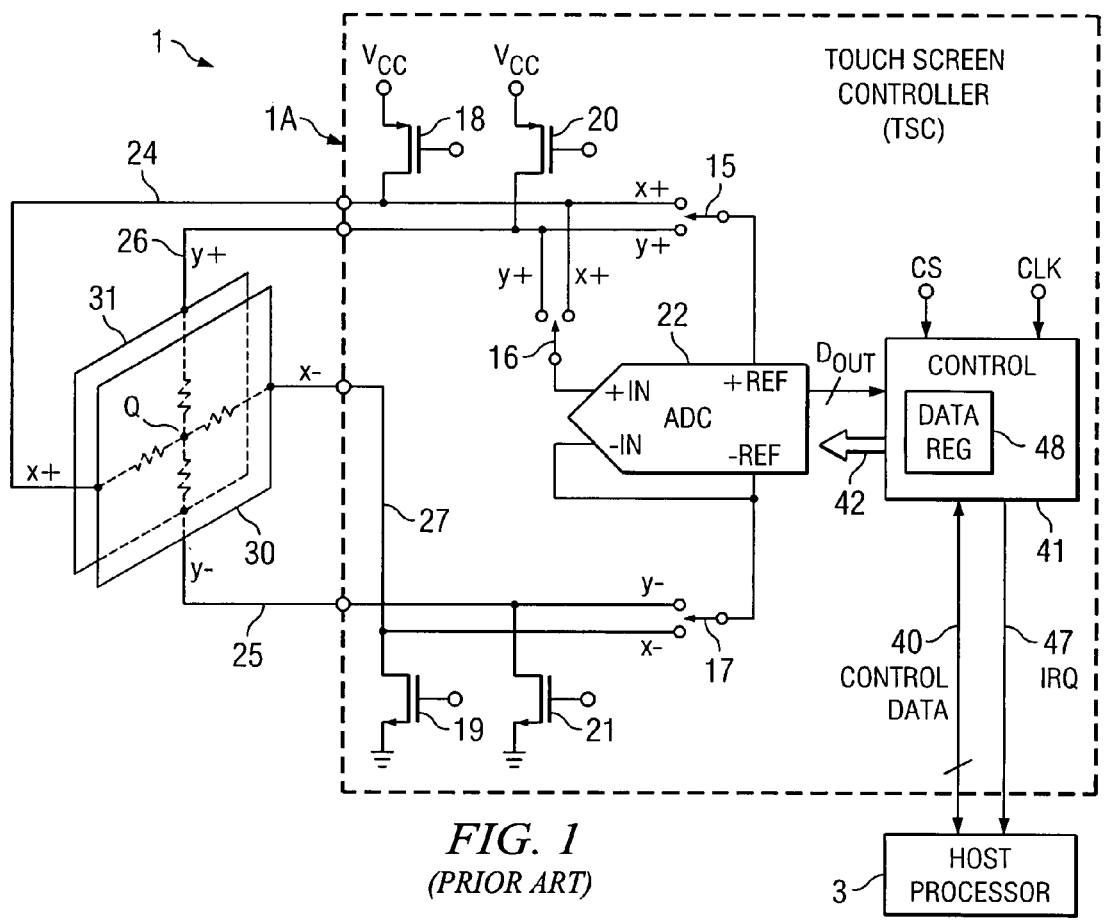
FIG. 1 is a schematic diagram showing the touch point coordinate conversion part of a prior art touch screen controller.
Figure 5:
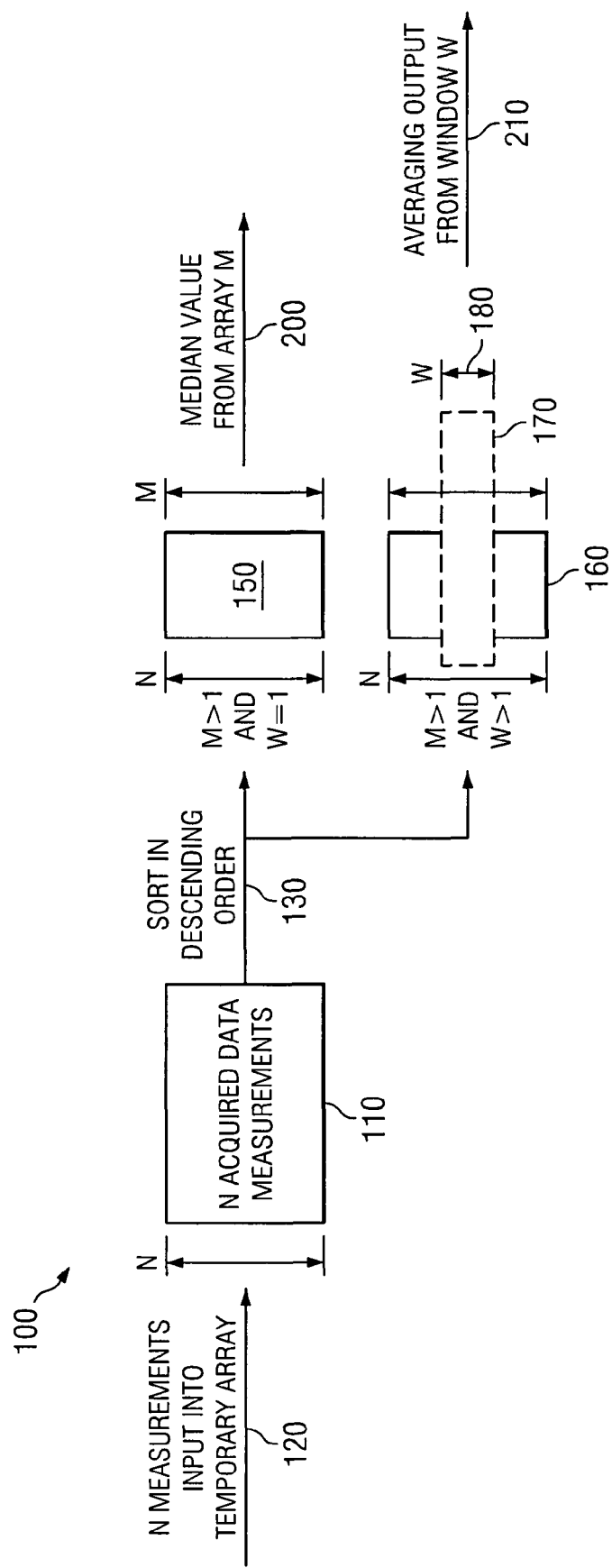
FIG. 5 is a diagram that shows how the median filter of FIG. 4 and the mean filter of FIG. 3A can be used together to provide a median and mean coherent filter that is useful in a touch screen controller.

FIG. 5 shows a generalized flow diagram which in accordance with one embodiment of the present invention is intended to utilize a median and mean coherent filter, which can be implemented using various kinds of median filters and mean filters, in combination with a touch screen system of the general kind shown in Prior Art FIG. 1.

Referring to FIG. 5, block 110 indicates the median filtering operation described above with reference to FIGS. 2A-D, which requires the input of n input words representing n Digital measurements of an x or y coordinate of the present touch point Q. The received number n of digital input data measurements representing a touch point coordinate are sorted, as indicated by arrow 130. After the median filtering of block 110 and the sorting of block 130, the median value of the n measured and then sorted, the resulting arrangement of the sorted n conversion data values is represented by block 150.

As indicated by arrow 120, block 110 can be thought of as acquiring a list of n digital input words representing n measurements of a touch point coordinate, for example, input words X0, 1 . . . 6 in FIG. 3A. Typically, n is an odd number, so a median value can be readily selected as the mid-point of the array of input words after they have been sorted in order of their respective numerical values. Arrow 130 represents the sorting process of the sorting algorithm of FIG. 2 by means of the median filter 2A of FIG. 3A. After the sorting, the input word having the largest value can be thought of as being located at the top of a list represented by block 150, and the input word having the smallest value can be thought of as being located at the bottom of the list represented by block 150. Block 150 represents the n acquired input words, n preferably being an odd number, and M>1 and W=1, which simply means there is no window for averaging. (This represents a user-selected option in which only the median input word value is obtained, but no average value is obtained. n, the number of data samples acquired by the comparator swap state machines in median filter 2A of FIG. 3A, can be, for example, 15, 7, or 3. Arrow 200 represents outputting of only the median input word value provided by the median filter 2A.

A user-selectable option is represented by blocks 160 and 170 wherein M>1 and W>1. n can be, for example, 15, 7, or 3 samples. W can represent can be chosen to be equal to 8, for example, to allow convenient averaging by means of mean filter 3 shown in FIG. 4, which allows convenient binary division by 8 simply by shifting the binary point by 3 bits in the LSB direction.

For the first part of the median filter sorting, "irregular" touch point conversion data values, meaning overly large values and overly small touch point coordinate values, initially may be omitted, thereby leaving values only in the center portion of window W to be used for mean filter averaging process, which may result in a better representation of the n measured touch point input word values. This kind of averaging is valid for noise having a Gaussian distribution having both positive and negative values that tend to cancel each other out.

By way of definition, is to be understood that although the state machines 38 are described in the specification and claims as being in rows and columns for purposes of convenient description, it of course is not necessary that they be physically arranged in rows and columns on the surface of an integrated circuit chip to be within the scope of the claims.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, there are various ways to implement a median filter function and a mean filter function which may be advantageously used to obtain better touch point coordinate values from any touch screen controller. For example, the median filter function may be performed using software or firmware, either within the touch screen controller or within the host processor. Similarly, the mean filter function also may be performed using software or firmware, either within the touch screen controller or within the host processor.

What is claimed is:

1. Conversion circuitry comprising:
circuitry for generating a first number of digital data numbers each having a second number of bits; and
sorting circuitry for sorting the digital data numbers in order of their respective values, including a plurality of compare and swap state machines including a number of rows of the state machines and a number of columns of the state machines, each state machine having first and second inputs, first and second outputs, and a reset input, each state machine having an equal state to which the state machine can be reset wherein the first and second inputs and the first and second outputs all are equal, a swap state into which the state machine can be switched if it is in its equal state wherein the first and second inputs are swapped so as to be presented at the second and first outputs, respectively, if the first input is less than the second input, and a pass state into which the state machine can be switched if it is in its equal state wherein the first and second inputs are presented unchanged at the first and second outputs, respectively, if the first input is greater than the second input, wherein if the state machine is switched into either the swap state or the pass state, that state is locked into the state machine until a future reset signal occurs, wherein the first output of each odd-numbered state machine is connected to the second input of a state machine in a next column of the same row as that odd-numbered state machine, and the second output is connected to the first input of a state machine in a next lower row of a next column, wherein the second output of each even-numbered state machine is connected to the first input of a state machine in a next column of the same row as that even-numbered state machine, and the first output is connected to the second input of a state machine in a next higher row of a next column, and wherein the digital data numbers are shifted bit by bit, with most significant bits first, into the various first and second inputs of the state machines in a first column.

2. The conversion circuitry of claim 1 including a plurality of reset circuits, each coupled to the reset inputs of the state machines in a corresponding column, operative to successively apply reset pulses to the reset inputs of the state machines in each column to reset the state machines of each column to the equal state before the most significant bits of the digital data numbers are shifted to the first and second inputs of the state machines of each column.

3. The conversion circuitry of claim 1 wherein the number of columns is equal to the second number, and wherein the first input of each of a plurality of even-numbered state machines in a top row of state machines is coupled to a first reference voltage and wherein the second input of each of a plurality of odd-numbered state machines in a bottom row is coupled to a second reference voltage.

4. The conversion circuitry of claim 3 including a plurality of serial-input digital buffers for receiving sorted digital data numbers from at least some of the various first and second outputs of the state machines of a last column into which the most significant bits of the digital data words are shifted, wherein at least some of the sorted digital data words are shifted into corresponding serial-input digital buffers.

5. The conversion circuitry of claim 4 wherein the serial-input digital buffers have parallel outputs.

6. The conversion circuitry of claim 5 wherein the sorting circuitry is included in a median filter.

7. The conversion circuitry of claim 5 wherein the circuitry for generating the digital data numbers includes an analog to digital converter of a touch screen controller and wherein the digital data numbers include multiple coordinate values of a particular touch point of a touch screen assembly, the conversion circuitry including a mean filter for averaging at least some of the sorted digital data numbers.

8. The conversion circuitry of claim 7 wherein the mean filter includes multiplexer circuitry coupled to receive a selected number of the sorted digital data numbers and sequentially couple them to inputs of digital adder circuitry for producing a sum of the selected, sorted digital data numbers and divider circuitry for dividing the sum by the selected number to produce an average value of the selected number of the sorted digital data numbers.

9. The conversion circuitry of claim 8 wherein the sum includes a doubly weighted value of a median sorted digital data number produced by the median filter and wherein the dividing is accomplished by binary shifting.

10. The conversion circuitry of claim 6 including a mean filter for averaging all of the sorted digital data numbers.

11. The conversion circuitry of claim 6 including a mean filter for averaging a plurality of the digital data numbers in a middle range which omits digital data numbers likely to include portions due to unacceptably large noise spike voltages.

12. The conversion circuitry of claim 3 wherein the circuitry for generating the digital data numbers includes an analog to digital converter of a touch screen controller and wherein the digital data numbers include multiple coordinate values of a particular touch point of a touch screen assembly.

13. The conversion circuitry of claim 3 wherein the number of rows of the state machines is 8 and the number of columns of the state machines is 15.

14. The conversion circuitry of claim 13 wherein the first number is equal to 8 and the second number is equal to 15.

15. A method of filtering digital data, comprising:
generating a first number of digital data numbers each having a second number of bits; and
sorting the digital data numbers in order of their respective values, by shifting the digital data numbers bit by bit, with most significant bits first, into various first and second inputs of a plurality of state machines in a first column of an array including a plurality of rows of the state machines and a plurality of columns of the state machines, each state machine having first and second inputs, first and second outputs, and a reset input, an equal state to which the state machine can be reset wherein the first and second inputs and first and second outputs all are equal, a swap state into which the state machine can be switched if it is in its equal state wherein the first and second inputs are swapped so as to be presented at the second and first outputs, respectively, if the first input is less than the second input, and a pass state into which the state machine can be switched if it is in its equal state wherein the first and second inputs are presented unchanged at the first and second outputs, respectively, if the first input is greater than the second input, wherein if the state machine is switched into either the swap state or the pass state, that state is locked into the state machine until a future reset signal occurs.

16. The method of claim 15 including coupling the first output of each odd-numbered state machine to the second input of the state machine in a next column in the same row as the odd-numbered state machine, and coupling the second output of that odd-numbered state machine to the first input of a state machine in a next lower row of a next column, coupling the second output of each even-numbered state machine to the first input of a state machine in a next column of the same row as the even-numbered state machine, and coupling the first output of that even-numbered state machine to the second input of a state machine in a next higher row of a next column.

17. The method of claim 16 including applying successive reset pulses to the reset inputs of the state machines in successive columns to reset the state machines in each column to the equal state before the most significant bits of the digital data numbers reach the first and second inputs of the state machines of that column.

18. The method of claim 17 including shifting at least some sorted digital data words produced by the sorting into a plurality of serial-input digital buffers, a middle one of the serial-input digital buffers containing a median sorted digital data word.

19. The method of claim 18 including averaging the sorted digital data words by means of a mean filter.

20. A circuit for filtering a first number of digital data numbers each having a second numbers of bits, comprising:
a plurality of rows of the state machines and a plurality of columns of the state machines, each state machine having first and second inputs, first and second outputs, and a reset input, an equal state to which the state machine can be reset wherein the first and second inputs and the first and second outputs all are equal, a swap state into which the state machine can be switched if it is in its equal state wherein the first and second inputs are swapped so as to be presented at the second and first outputs, respectively, if the first input is less than the second input, and a pass state into which the state machine can be switched if it is in its equal state wherein the first and second inputs are presented unchanged at the first and second outputs, respectively, if the first input is greater than the second input, wherein if the state machine is switched into either the swap state or the pass state, that state is locked into the state machine until a future reset signal occurs; and
means for sorting the digital data numbers in order of their respective values, by shifting the digital data numbers bit by bit, with most significant bits first, into various first and second inputs of the state machines in a first column of an array of the state machines.

21. An apparatus comprising:
an analog-to-digital converter (ADC) that is adapted to generate digital data numbers representing a plurality of coordinate values, respectively, of a touch point of a touch screen; and
a temporary array that stores a the digital data numbers generated by the ADC; and
a median filter that receives the digital data numbers from the temporary array, wherein the median filter includes an array of state machines that sorts the digital data numbers in order of their values, respectively; and
an averaging circuit that calculates an average of a set of the sorted digital numbers, wherein the averaging circuit includes:
a first multiplexer;
an adder that is coupled to the first multiplexer;
a second multiplexer that is coupled to the adder;
a first set of flip-flops that is coupled to the second multiplexer and the adder;
a shifter that is coupled to the adder; and
a second set of flip-flops that is coupled to the shifter.

22. The apparatus of claim 21, wherein each state machine:
receives a first number and a second number;
compares the first number and the second number;
passes the first number and second number if the first number is greater than the second number; and
swaps the first number and second number if the second number is greater than the first number.

* * * * *